US008698380B2

(12) United States Patent
Watanabe et al.

(10) Patent No.: US 8,698,380 B2

(45) Date of Patent: Apr. 15, 2014

(54) PREFERENTIALLY-ORIENTED OXIDE CERAMICS, PIEZOELECTRIC ELEMENT, LIQUID DISCHARGE HEAD, ULTRASONIC MOTOR, AND DUST REMOVING DEVICE

(71) Applicants: Canon Kabushiki Kaisha, Tokyo (JP); University of Yamanashi, Kofu (JP)

(72) Inventors: Takayuki Watanabe, Kawasaki (JP); Makoto Kubota, Yokohama (JP); Jumpei Hayashi, Chofu (JP); Nobuhiro Kumada, Kofu (JP); Tomoaki Mochiduki, Kofu (JP)

(73) Assignees: Canon Kabushiki Kaisha, Tokyo (JP); University of Yamanashi, Kofu-shi (JP)

( * ) Notice: Subject to any disclaimer, the term of this patent is extended or adjusted under 35 U.S.C. 154(b) by 0 days.

(21) Appl. No.: 13/829,596

(22) Filed: Mar. 14, 2013

(65) Prior Publication Data

US 2013/0200750 A1 Aug. 8, 2013

Related U.S. Application Data

(62) Division of application No. 13/023,043, filed on Feb. 8, 2011.

(30) Foreign Application Priority Data

Feb. 10, 2010 (JP) ................................ 2010-028179
Feb. 7, 2011 (JP) ................................ 2011-023451

(51) Int. Cl.
*H01L 41/187* (2006.01)

(52) U.S. Cl.
USPC ..................... 310/358; 501/137; 252/62.9 PZ

(58) Field of Classification Search
USPC ..................... 310/358; 501/137; 252/62.9 PZ
See application file for complete search history.

(56) References Cited

U.S. PATENT DOCUMENTS 2,988,422 A 6/1961 Walsh
6,789,956 B2 * 9/2004 Iwaki et al. .................... 385/88
6,911,107 B2 * 6/2005 Kagawa et al. ............... 156/230
7,906,889 B2 * 3/2011 Furuta et al. ................. 310/358
7,931,821 B2 4/2011 Saito et al.

(Continued)

FOREIGN PATENT DOCUMENTS

JP 2008-37064 A 2/2008
WO 2010/125987 A1 11/2010

OTHER PUBLICATIONS

Yoshio Sakka et al., "Fabrication and Some Properties of Textured Alumina-Related Compounds by Colloidal Processing in High-Magnetic Field and Sintering," 28 Journal of the European Ceramic Society 935-942 (Oct. 2007).

(Continued)

*Primary Examiner* — Derek Rosenau
*Assistant Examiner* — Bryan Gordon
(74) *Attorney, Agent, or Firm* — Fitzpatrick, Cella, Harper & Scinto

(57) ABSTRACT

Provided is a manufacturing method for preferentially-oriented oxide ceramics having a high degree of crystal orientation. The manufacturing method includes: obtaining slurry containing an oxide crystal B having magnetic anisotropy; applying a magnetic field to the oxide crystal B, and obtaining a compact of the oxide crystal B; and subjecting the compact to oxidation treatment to obtain preferentially-oriented oxide ceramics including a compact of an oxide crystal C having a crystal system that is different from a crystal system of one of a part and a whole of the oxide crystal B. By (1) reacting raw materials, (2) reducing the oxide crystal A, or (3) keeping the oxide crystal A at high temperature and quenching the oxide crystal A, the oxide crystal B is obtained to be used in the slurry.

8 Claims, 8 Drawing Sheets

1013
1012
1011
101
108
103
102
104

(56) References Cited

U.S. PATENT DOCUMENTS

| | | | | |
|---|---|---|---|---|
| 2006/0279638 | A1* | 12/2006 | Matsuda et al. | 348/208.7 |
| 2009/0128608 | A1* | 5/2009 | Fukui | 347/68 |
| 2009/0243438 | A1* | 10/2009 | Hamada et al. | 310/358 |
| 2010/0025618 | A1 | 2/2010 | Watanabe et al. | |
| 2011/0012050 | A1 | 1/2011 | Hayashi et al. | |
| 2011/0193451 | A1* | 8/2011 | Watanabe et al. | 310/358 |
| 2011/0297870 | A1 | 12/2011 | Matsuda et al. | |
| 2013/0056671 | A1 | 3/2013 | Kubota et al. | |

OTHER PUBLICATIONS

Satoshi Wada et al., "Enhanced Piezoelectric Property of Barium Titanate Single Crystals with Engineered Domain Configurations," 38 (1:9B) Jpn. J. Appl. Phys. 5505-5511 (Sep. 1999).

Makiya et al., "Particle Oriented Bismuth Titanate Ceramics Made in High Magnetic Field", 111 Journal of the Ceramic Society of Japan 702-704 (2003).

Kirianov et al., "Studies on the Solid Solution of Mn in BaTi03", 40 (1:9B) Jpn. J. Appl. Phys. 5619-5623 (2001).

Arend et al., "Phase Composition of Reduced and Reoxided Barium Titanate", J. Am. Ceram. Soc. vol. 52, No. 2, Feb. 21, 1969, pp. 63-65.

Arend et al., "Importance of Oxidation and Reduction of Barium Titanate in Material Science", Ferroelectrics, 1997, vol. 202, pp. 1-10.

Glaister et al., "An Investigation of the Cubic-Hexagonal Transition in Barium Titanate", Proceedings of the Physical Society, 1960, pp. 763-771.

Office Action in U.S. Appl. No. 13/023,043 (mailed Apr. 29, 2013).

* cited by examiner

310

SAME PHASE
HOLD
HOLD
HOLD
330
320

OPPOSITE PHASE
320
HOLD
HOLD
HOLD
HOLD

PREFERENTIALLY-ORIENTED OXIDE CERAMICS, PIEZOELECTRIC ELEMENT, LIQUID DISCHARGE HEAD, ULTRASONIC MOTOR, AND DUST REMOVING DEVICE

CROSS REFERENCE TO RELATED APPLICATIONS

This application is a divisional of application Ser. No. 13/023,043, filed Feb. 8, 2011, which claims the benefit of Japanese Patent Application No. 2010-028179, filed Feb. 10, 2010, and Japanese Patent Application No. 2011-023451, filed Feb. 7, 2011. All prior applications are hereby incorporated by reference herein in their entirety.

BACKGROUND OF THE INVENTION

1. Field of the Invention

The present invention relates to a manufacturing method for preferentially-oriented oxide ceramics, and more particularly, to a manufacturing method for oxide piezoelectric ceramics. The present invention also relates to a piezoelectric element using the preferentially-oriented oxide ceramics, and a liquid discharge head, an ultrasonic motor, and a dust removing device, which utilize the piezoelectric element.

2. Description of the Related Art

Controlling the crystal orientation of the piezoelectric materials can effectively improve the piezoelectric performance of the piezoelectric materials. Because the piezoelectric property is an anisotropic physical property, the piezoelectric property of preferentially-oriented oxide ceramics is superior to that of randomly-oriented oxide ceramics.

As a method for manufacturing such preferentially-oriented oxide ceramics, a magnetic orientation method is disclosed in Sakka et al., "Journal of the European Ceramic Society", 2008, vol. 28, pp. 935-942. According to this document, torque T(N·m) applied to a crystal in a magnetic field is expressed by the following equation (1).

$$T = -\frac{\Delta x V B^2 \sin 2\theta}{2\mu_0} \quad \text{Equation (1)}$$

In the equation, B represents magnetic field intensity ($N \cdot A^{-1} \cdot m^{-1}$), μ0 represents vacuum magnetic permeability ($N \cdot A^{-2}$), θ represents an angle (degrees) between an axis of easy magnetization of the crystal and the magnetic field, and V represents particle volume ($m^3$). This torque affects the crystal so that the axis of easy magnetization of the crystal and the magnetic field become parallel to each other.

Japanese Patent Application Laid-Open No. 2008-37064 discloses that tetragonal barium titanate as a typical piezoelectric material has (001) orientation in a magnetic field (tetragonal perovskite crystals are regarded as pseudo-cubic perovskite crystals in this specification unless otherwise noted). This means that the axis of easy magnetization of barium titanate is in <001> direction.

However, in Wada et al., "Japanese Journal of Applied Physics", 1999, vol. 38, pp. 5505-5511, it is reported that when a voltage is applied in <111> direction in tetragonal perovskite piezoelectric materials, an engineered domain configuration is formed so that good piezoelectric property can be obtained. In other words, although a high performance piezoelectric element can be obtained by producing ceramics having (111) orientation, it is not easy to produce barium titanate ceramics having (111) orientation by the conventional magnetic orientation method because the axis of easy magnetization of tetragonal barium titanate is in <001> direction.

The conventional method has a problem in that a (111) orientation structure cannot be obtained by the magnetic orientation if the crystal has the axis of easy magnetization in <001> direction.

SUMMARY OF THE INVENTION

The present invention is made in view of such background, and an object thereof is to provide a manufacturing method for oxide ceramics having (111) orientation. Another object of the present invention is to provide a piezoelectric element using preferentially-oriented oxide ceramics obtained by the manufacturing method, and to provide a liquid discharge head, an ultrasonic motor, and a dust removing device, which utilize the piezoelectric element.

A first aspect of the present invention relates to a manufacturing method for preferentially-oriented oxide ceramics including: obtaining slurry containing an oxide crystal B; applying a magnetic field to the oxide crystal B, and obtaining a compact of the oxide crystal B; and subjecting the compact to oxidation treatment to obtain preferentially-oriented oxide ceramics including an oxide crystal C having a crystal system that is different from a crystal system of one of a part and a whole of the oxide crystal B.

A second aspect of the present invention relates to preferentially-oriented oxide ceramics manufactured by the above-mentioned manufacturing method.

A third aspect of the present invention relates to a piezoelectric element including a first electrode, a piezoelectric material, and a second electrode, in which the piezoelectric material is the preferentially-oriented oxide ceramics.

A fourth aspect of the present invention relates to a liquid discharge head including the piezoelectric element.

A fifth aspect of the present invention relates to an ultrasonic motor including the piezoelectric element.

A sixth aspect of the present invention relates to a dust removing device including the piezoelectric element.

According to the present invention, it is possible to provide a manufacturing method for preferentially-oriented oxide ceramics having a high degree of crystal orientation.

Furthermore, the present invention may provide a piezoelectric element using preferentially-oriented oxide ceramics obtained by the manufacturing method, and may provide a liquid discharge head, an ultrasonic motor, and a dust removing device, which utilize the piezoelectric element.

Further features of the present invention will become apparent from the following description of exemplary embodiments with reference to the attached drawings.

DESCRIPTION OF THE EMBODIMENTS

Figure 1A:
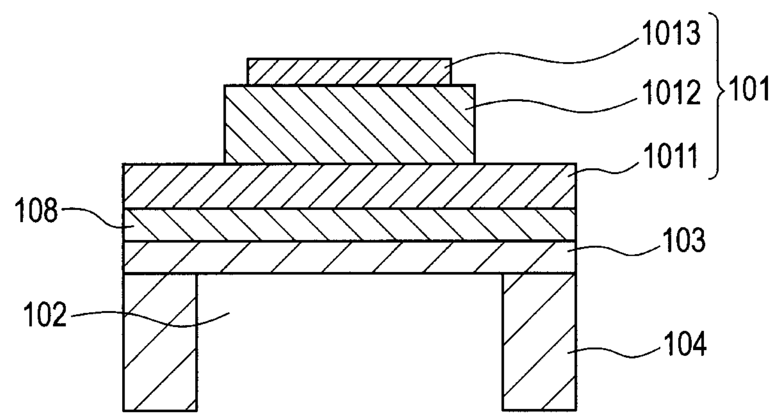
FIGS. 1A and 1B are schematic diagrams illustrating an embodiment of a liquid discharge head according to the present invention.

Hereinafter, an embodiment of the present invention is described.

A manufacturing method for preferentially-oriented oxide ceramics according to the present invention includes a step of obtaining slurry containing oxide crystal B, a step of applying magnetic field to the oxide crystal B and obtaining a compact of the oxide crystal B, and a step of subjecting the compact to oxidation treatment so as to obtain preferentially-oriented oxide ceramics made of a compact of oxide crystal C having a crystal system that is different from that of a part or a whole of the oxide crystal B.

It is considered that the preferentially-oriented oxide ceramics according to the present invention can be used for various applications such as capacitor material, thermoelectric material, or piezoelectric material. In the following description, it is supposed that the application is piezoelectric material. As a matter of course, it is needless to say that the application of the oxide according to the present invention is not limited to the piezoelectric element.

The crystal systems in the present invention indicate seven groups in which crystals are classified in accordance with the axial ratio and the axial angles. The crystal systems include seven types, which are the cubic system, the tetragonal system, the orthorhombic system, the rhombohedral system, the hexagonal system, the monoclinic system, and the triclinic system. In the present invention, the oxide crystal C having a crystal system that is different from that of a part or a whole of the oxide crystal B means the case where the oxide crystal C has a crystal system which the oxide crystal B does not have. For instance, it is the case where the oxide crystal B is hexagonal while the oxide crystal C is tetragonal. In addition, it is also the case where the number of crystal systems which the oxide crystal C has is smaller than the number of crystal systems which the oxide crystal B has. For instance, it is the case where the oxide crystal B has the tetragonal system and the hexagonal system, while the oxide crystal C has only the tetragonal system.

According to the manufacturing method for preferentially-oriented oxide ceramics according to the present invention, the step of obtaining the oxide crystal B is performed first. As an example of the step of obtaining the oxide crystal B, methods (1), (2), and (3) described below are employed. As a matter of course, it is needless to say that the oxide crystal B may be prepared in advance as starting material so as to jump to the step of obtaining the compact described below.

(1) Step of Reacting Raw Materials to Obtain the Oxide Crystal B

As a specific example of the oxide crystal B, there are crystals such as hexagonal $BaTi_{0.9}Mn_{0.05}O_{3+\alpha}$, $BaTi_{0.9}Cu_{0.05}O_{2.85}$, and the like. These crystals are produced by solid-state reaction of barium carbonate, titanium oxide, manganese oxide, copper oxide, and the like. The oxide crystal B can be produced by the solid-state reaction, but the oxide crystal B may be produced by other methods such as the hydrothermal synthesis method or the oxalic method, which is superior for mass production and particle size control.

(2) Step of Subjecting the Oxide Crystal A to Reduction Treatment to Obtain the Oxide Crystal B Having a Crystal System Different from a Crystal System of the Oxide Crystal A The reduction treatment means subjecting the oxide crystal A to thermal treatment in reducing atmosphere, for example. Specifically, reduction treatment is thermal treatment of keeping temperature of 800 to 1,500 degrees centigrade in a gas atmosphere containing hydrogen at 10 percent by volume or higher for 10 minutes or longer. Preferably, the temperature of 800 to 1,500 degrees centigrade is kept for 10 minutes or longer under a pressure of the atmospheric pressure or higher in the gas atmosphere containing hydrogen at 10 percent by volume or higher.

In this reduction treatment, one or more of the following changes may occur in the oxide crystal A. (I) The crystal system may change. (II) The weight may reduce. (III) The reflectance when light having a wave length of 400 to 500 nm is projected may reduce. (IV) The resistivity may reduce.

As a specific example of the oxide crystal B, there is hexagonal barium titanate. The hexagonal barium titanate can be obtained by keeping tetragonal barium titanate (oxide crystal A) in a hydrogen atmosphere at a temperature of 1,400 to 1,500 degrees centigrade. After the reduction treatment, thermal treatment may be performed under the condition that the crystal system of the oxide crystal B is not changed.

(3) Step of Keeping the Oxide Crystal A at High Temperature and then Quenching the Oxide Crystal A, to Thereby Obtain the Oxide Crystal B Having a Crystal System That is Different from the Crystal System of the Oxide Crystal A As a specific example of the oxide crystal B, there is hexagonal barium titanate. When tetragonal barium titanate at room temperature (oxide crystal A) is heated up to approximately 1,500 degrees centigrade or higher, the crystal system changes into hexagonal system. By quenching the hexagonal barium titanate after the phase transition, hexagonal barium titanate at room temperature is obtained.

In the cases (2) and (3) exemplified above, the oxide crystal A has the same metal composition as the oxide crystal B and at least one type of different crystal system.

Magnetic susceptibility of the oxide crystal B obtained by the above-mentioned methods is not isotropic. The oxide crystal B can be oriented by torque of a magnetic field when the oxide crystal B is placed in the magnetic field having intensity that is currently available in the industry (e.g., up to approximately 12 T).

In order to produce slurry containing oxide crystal B, it is necessary to crush the oxide crystal B into powder as necessary. If the crystal grains of the oxide crystal B are too large, the crystal grains precipitate soon in the slurry so as not to be oriented. If the crystal grains are too small, the crystal grains agglomerate in the slurry. Therefore, the average grain diameter is preferably 10 microns or smaller and 10 nm or larger, and more preferably 1 microns or smaller and 50 nm or larger.

The average grain diameter and grain size distribution in the slurry can be measured by dynamic light scattering, for example.

The slurry generally includes crystal grains as the main component, a solvent, and additives such as a dispersant, a defoamer, and a charging agent. For instance, when the compact containing the oxide crystal B is produced by slip casting, the solvent is preferred to be water from a viewpoint of safety, cost, and surface tension. In the weight of the slurry, the crystal grains are preferred to occupy 40 to 80 percent by weight. If a ratio of the crystal grains to the solvent is too large, the viscosity of the slurry becomes too high, and hence smooth orientation of the crystal grains in the magnetic field is hindered. On the other hand, if the ratio is too small, the amount of slurry necessary for obtaining a desired thickness of the compact is increased, and hence it is not practical. Therefore, the ratio of the crystal grains in the slurry is preferably 40 to 80 percent by weight.

The above-mentioned oxide powder may contain only the oxide crystal B, or other metallic compound may be added for a purpose of adjusting characteristics of the preferentially-oriented ceramics. As specific examples of the metallic compound, there are $BaCO_3$, $BaC_2O_4$, $MnCO_3$, $Nb_2O_5$, $Ta_2O_5$, $V_2O_5$, $WO_3$, $CaTiO_3$, $(Bi_{1/2}Na_{1/2})TiO_3$, $Bi(Mg_{1/2}Ti_{1/2})O_3$, and the like.

It is preferred that the crystal grains dispersed in the slurry be not condensed. If the crystal grains are condensed, magnetic anisotropy of individual grains are canceled with each other, and hence the orientation of the crystal grains in the magnetic field is hindered. In addition, it is preferred that the viscosity of the slurry be low. It is because if the viscosity of the slurry is low, the dispersed crystal grains can easily rotate when the magnetic field gives torque to the crystal grains. Therefore, an organic component such as a dispersant or a surface active agent may be added as an additive to the slurry so as to improve dispersion property of the crystal grains or to decrease the viscosity of the slurry. In addition, a binder may be added so as to increase the density of the preferentially-oriented ceramics. Further, a charging agent may be added to the slurry in order to use electrophoresis as a method of producing the compact.

By the above-mentioned methods, the oxide crystal B can be produced, and the slurry containing the oxide crystal B can be obtained. However, other methods may be used for producing the slurry containing the oxide crystal B.

The next step is to apply a magnetic field to the oxide crystal B, so as to obtain the compact of the oxide crystal B.

In order to produce the compact, a container containing the slurry is placed in the magnetic field and is left until the crystal powder deposits. In order to produce the compact in a shorter period, the slip casting or the electrophoresis in the magnetic field can be utilized. The slip casting can produce the compact having an arbitrary shape with a high density. The electrophoresis can produce a compact sheet on an electrode immersed in the slurry.

As to the present invention, the case is mainly described where the growing direction of the compact in the magnetic field is parallel to the magnetic field. However, the angle between the magnetic field and the accumulation direction can be changed arbitrarily depending on the orientation of the crystal to be formed.

The intensity of the magnetic field to be applied is preferred to be large. However, if the magnetic field intensity is too large, a facility for generating and shielding the magnetic field may be large scale, or a risk in the work may be increased notably. On the contrary, if the magnetic field intensity is too small, the grains are not oriented. Therefore, the intensity of the magnetic field to be used is preferred to be at most 15 T or smaller and 1 T or larger.

The next step is to subject the compact to oxidation treatment, so as to obtain the preferentially-oriented oxide ceramics formed of the oxide crystal C having a crystal structure that is different from that of a part or a whole of the oxide crystal B.

The oxidation treatment is treatment of heating the compact in an oxidizing atmosphere such as the air. Specifically, the oxidizing atmosphere is an atmosphere with an oxygen concentration at 18 percent by volume or higher, and the treatment is thermal treatment in which a temperature at 400 to 1,450 degrees centigrade is kept for 10 minutes or longer. Preferably, a temperature at 600 to 1,450 degrees centigrade is kept for 10 minutes or longer under a pressure of the atmospheric pressure or higher in the atmosphere with the oxygen concentration at 18 percent by volume or higher. This oxidation treatment may also work as the sintering process that is usually performed in the process of producing ceramics.

In this oxidation treatment, one or more of the following changes may occur to the oxide crystal B. (I) The crystal system may change. (II) The weight may increase. (III) The reflectance when light having a wave length of 400 to 500 nm is projected may increase. (IV) The resistivity may increase.

The degree of orientation of the obtained preferentially-oriented oxide ceramics can be evaluated by a Lotgering factor.

The Lotgering factor (F) is calculated by the equation (2) with reference to a peak intensity of the X-ray diffracted from a crystal surface to be measured.

$$F=(\rho-\rho_0)/(1-\rho_0) \quad \text{Equation (2)}$$

Here, $\rho_0$ is calculated by using the diffraction intensity ($I_0$) of the X-ray with respect to the randomly-oriented sample. The Lotgering factor of the tetragonal crystal with (001) orientation is calculated by the equation (3), as a ratio of a sum of 001 diffraction intensity to the total diffraction intensity of the randomly-oriented sample.

$$\rho_0=\Sigma I_0(001)/\Sigma I_0(hkl) \quad \text{Equation (3)}$$

where h, k, and l represent integers.

A value of ρ is calculated using the diffraction intensity (I) of the X-ray with respect to the orientation sample. In the case of the tetragonal crystal with (001) orientation, it is calculated as a ratio of a sum of 001 diffraction intensities to the total diffraction intensity, by the equation (4), similarly to the equation (3).

$$\rho=\Sigma I(001)/\Sigma I(hkl) \quad \text{Equation (4)}$$

The Lotgering factor of the randomly-oriented sample is substantially zero. If the Lotgering factor is 10% or larger, it can be determined that the sample is preferentially-oriented ceramics.

The same metal composition described in the present invention permits at most 5% of metal composition change due to evaporation or the like caused in the step of the reduction treatment, the oxidation treatment, or the sintering process.

The preferentially-oriented oxide ceramics obtained by the present invention is desired to be a piezoelectric material. The oxide ceramics includes many piezoelectric materials. The piezoelectric property is anisotropic physical property that is changed in accordance with an orientation of the crystal. Therefore, it is important to control the crystal orientation in order to obtain high piezoelectric property. Therefore, if the preferentially-oriented ceramics is a piezoelectric material, the present invention can be applied appropriately and suitably.

Furthermore, the preferentially-oriented oxide ceramics obtained by the present invention is desired not to contain lead in its composition. Lead is restricted because lead is poisonous when it is accumulated in the human body.

In the manufacturing method for preferentially-oriented oxide ceramics according to the present invention, the crystal structure of the preferentially-oriented oxide ceramics is preferred to be a perovskite structure. Many in this material system have ferroelectricity and a wide industrial usage.

In the manufacturing method for preferentially-oriented oxide ceramics according to the present invention, the crystal structure of the oxide crystal B is preferred to be a 6H type hexagonal structure. For instance, the axis of easy magnetization of the 6H type hexagonal barium titanate is the c-axis. Therefore, when the slurry containing the hexagonal barium titanate crystal is supplied into the plaster mold placed in the vertical magnetic field (slip casting), it is possible to obtain the compact of the hexagonal barium titanate oriented in the c-axis direction. Further, the stacking sequence of atoms in the c-axis direction of the 6H type hexagonal barium titanate crystal is similar to the stacking sequence of atoms in the <111> direction of the perovskite crystals that are usually expressed in $ABO_3$. Therefore, when the 6H type hexagonal barium titanate crystal oriented in the c-axis direction is obtained, it is possible to change the crystal structure to the perovskite structure with (111) orientation by an appropriate treatment. The perovskite-structured piezoelectrics with (111) orientation can be expected to have good piezoelectric property by the engineered domain configuration. Especially in the case of the tetragonal barium titanate, due to a contribution of a large piezoelectric constant $d_{15}$, it can be expected that an apparent piezoelectric constants $d_{33}$ and $d_{31}$ of the (111)-oriented ceramics are increased compared with those of the randomly-oriented ceramics.

Therefore, the crystal structure of the oxide crystal B is preferably the 6H type hexagonal structure. More preferably, the oxide crystal B is the 6H type hexagonal barium titanate.

One of the compositions of the preferentially-oriented oxide ceramics according to the present invention is expressed by the general formula (1) below, and the c-axis of the perovskite ceramics is tilted radially by 40 to 70 degrees with respect to a specific axis. The specific axis means a perpendicular line to the surface of the sample, the growing direction of the compact, or an axis connecting a pair of electrodes given to the sample by the shortest distance.

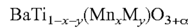

$BaTi_{1-x-y}(Mn_xM_y)O_{3+\alpha}$ General Formula (1)

In the formula, M represents at least one element selected from the group consisting of V, Nb, Ta, and W. The expressions $0.02<x\leq 0.05$, $0<y\leq 0.05$, and $-0.05<\alpha\leq 0.05$ are satisfied.

A value of $\alpha$ changes in accordance with the amount and the valence of the metallic element. In the present invention, a value of $\alpha$ cannot be easily determined because the valence of Mn is usually unstable, and hence evaluation thereof is difficult. However, because manganese monoxide and manganese dioxide are available, it is assumed that the valence of manganese becomes +2 or larger and +4 or smaller. Therefore, it is expected that the range of a value of $\alpha$ satisfies $-0.05<\alpha\leq 0.05$.

If x is 0.02 or smaller, the amount of hexagonal crystal which can obtain sufficient effect by the magnetic orientation cannot be obtained. If x is larger than 0.05, the piezoelectric property of the obtained preferentially-oriented oxide ceramics is decreased, which is not preferred.

$BaTi_{1-x-y}Mn_xO_{3+\beta}$ contains at least a hexagonal crystal. The composition of the oxide powder constituting the slurry is made to be the composition expressed by $BaTi_{1-x-y}Mn_xO_{3+\beta}+\gamma MO_\gamma$, and the thermal treatment is performed after obtaining the compact in the magnetic field. Then, hexagonal $BaTi_{1-x-y}Mn_xO_{3+\beta}$ reacts with $MO_\gamma$ and transform into a tetragonal crystal. M is an element having a higher valence than Ti.

The ceramics produced by the manufacturing method according to the present invention has high orientation, which is preferred.

Hereinafter, the piezoelectric element using the piezoelectric ceramics according to the present invention is described.

The piezoelectric element according to the present invention is a piezoelectric element including at least a first electrode, piezoelectric ceramics, and a second electrode, and the piezoelectric ceramics is the above-mentioned piezoelectric ceramics.

The first electrode and the second electrode are each formed of a conductive layer having a thickness of about 5 nm to 2,000 nm. The material for the conductive layer is not particularly limited, and may be a material which is typically used in a piezoelectric element. Examples of such material include metals such as Ti, Pt, Ta, Ir, Sr, In, Sn, Au, Al, Fe, Cr, Ni, Pd, Ag, and Cu, and oxides of these metals. Each of the first electrode and the second electrode may be formed of one kind of those materials, or may be obtained by laminating two or more kinds of them. The first electrode and the second electrode may each be formed of a different material.

The method of forming the first electrode and the second electrode is not limited. The first electrode and the second electrode may be formed by baking metal paste or by sputtering or vapor deposition. In addition, both the first electrode and the second electrode may be patterned in desired shapes for use.

Figure 1B:
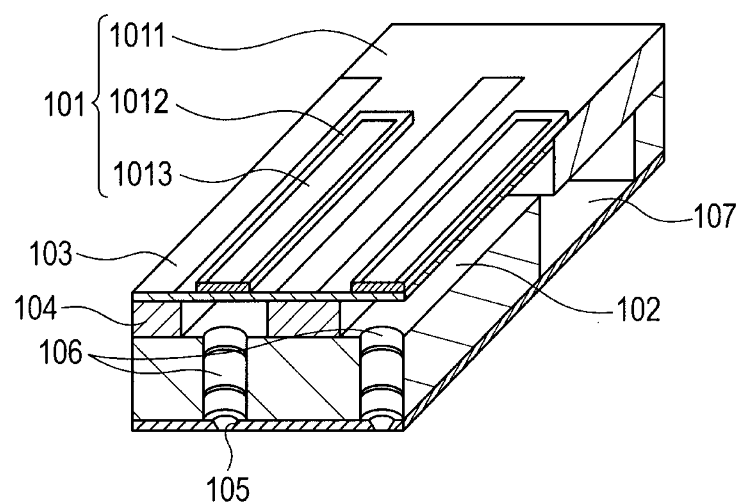

FIGS. 1A and 1B are each a schematic view illustrating an embodiment of a structure of a liquid discharge head of the present invention. As illustrated in FIGS. 1A and 1B, the liquid discharge head of the present invention is a liquid discharge head including a piezoelectric element 101 of the present invention. The piezoelectric element 101 is a piezoelectric element including at least a first electrode 1011, piezoelectric ceramics 1012, and a second electrode 1013. The piezoelectric ceramics 1012 is patterned as required as illustrated in FIG. 1B.

FIG. 1B is a schematic view of the liquid discharge head. The liquid discharge head includes discharge ports 105, individual liquid chambers 102, communicating holes 106 for connecting the individual liquid chambers 102 and the discharge ports 105, liquid chamber partition walls 104, a common liquid chamber 107, a diaphragm 103, and the piezoelectric elements 101. Each of the piezoelectric elements 101, which is of a rectangular shape in the figure, may be of a shape except the rectangular shape such as an elliptical shape, a circular shape, or a parallelogram shape. In general, the piezoelectric ceramics 1012 are each of a shape in conformity with the shape of the individual liquid chamber 102.

The vicinity of the piezoelectric element 101 in the liquid discharge head of the present invention is described in detail with reference to FIG. 1A. FIG. 1A is a sectional view of the piezoelectric element in the width direction of the liquid discharge head illustrated in FIG. 1B. The sectional shape of the piezoelectric element 101, which is illustrated in a rectangular shape, may be a trapezoidal shape or a reverse trapezoidal shape.

In the figure, the first electrode 1011 is used as the lower electrode, and the second electrode 1013 is used as the upper electrode. However, the arrangement of the first electrode 1011 and the second electrode 1013 is not limited to the foregoing. For example, the first electrode 1011 may be used as the lower electrode, or may be used as the upper electrode. Similarly, the second electrode 1013 may be used as the upper electrode, or may be used as the lower electrode. In addition, a buffer layer 108 may be present between the diaphragm 103 and the lower electrode.

Note that, those differences in name are caused by a manufacturing method for the device and an effect of the present invention can be obtained in any case.

In the liquid discharge head, the diaphragm 103 vertically fluctuates owing to the expansion and contraction of the piezoelectric ceramics 1012 to apply a pressure to liquid in the individual liquid chamber 102. As a result, the liquid is discharged from the discharge port 105. The liquid discharge head of the present invention can be used in a printer application or the manufacture of an electronic device.

The diaphragm 103 has a thickness of 1.0 μm or more to 15 μm or less and preferably 1.5 μm or more to 8 μm or less. A material for the diaphragm, which is not limited, is preferably Si. Si for the diaphragm may be doped with B or P. In addition, the buffer layer and the electrode layer on the diaphragm may serve as part of the diaphragm.

The buffer layer 108 has a thickness of 5 nm or more to 300 nm or less and preferably 10 nm or more to 200 nm or less.

The size of the discharge port 105 is 5 μm or more to 40 μm or less in terms of a circle-equivalent diameter. The shape of the discharge port 105 may be a circular shape, or may be a star shape, a square shape, or a triangular shape.

Next, an ultrasonic motor using the piezoelectric element according to the present invention is described.

Figure 2A:
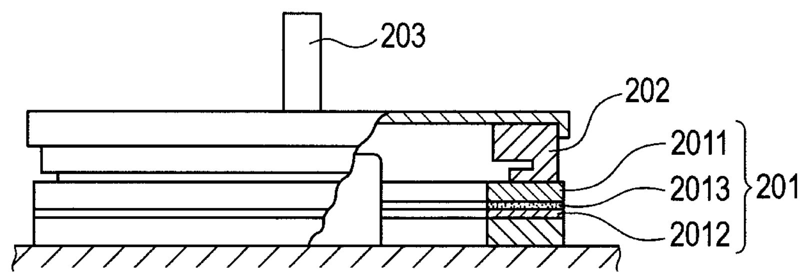
FIGS. 2A and 2B are schematic diagrams illustrating an embodiment of an ultrasonic motor according to the present invention.
Figure 2B:
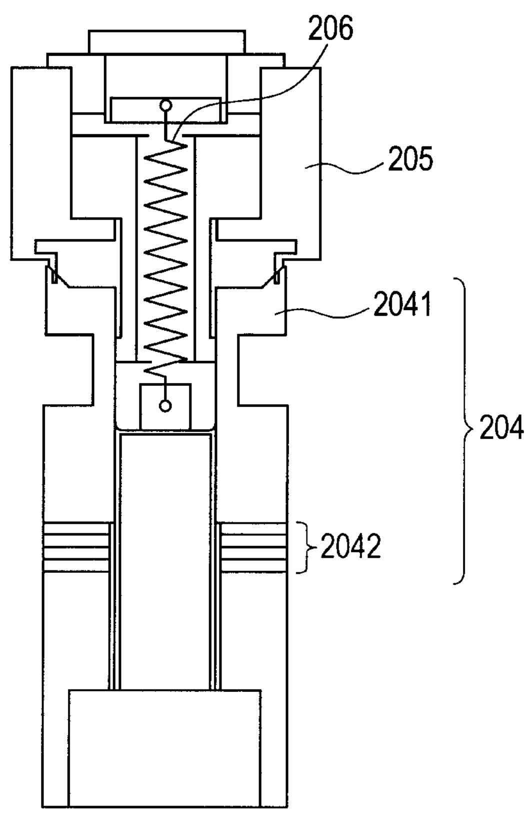

FIGS. 2A and 2B are schematic views illustrating an embodiment of a structure of the ultrasonic motor according to the present invention.

The ultrasonic motor includes a vibrator 201, a rotor 202 contacting the sliding surface of the vibrator 201 by virtue of a pressure applied from a pressurizing spring (not shown), and an output axis 203 provided so as to be integral with the rotor 202. The vibrator 201 is formed of a metal elastic ring 2011, a piezoelectric element 2012 of the present invention, and an organic adhesive 2013 for bonding the piezoelectric element 2012 to the elastic ring 2011 (such as an epoxy- or cyanoacrylate-based adhesive). The piezoelectric element 2012 of the present invention is formed of piezoelectric ceramics interposed between a first electrode (not shown) and a second electrode (not shown).

The application of two alternating electric field different from each other in phase by π/2 to the piezoelectric element of the present invention results in the generation of a bending travelling wave in the vibrator 201, and hence each point on the sliding surface of the vibrator 201 undergoes an elliptical motion. When the rotor 202 is brought into press contact with the sliding surface of the vibrator 201, the rotor 202 receives a frictional force from the vibrator 201 to rotate in the direction opposite to the bending travelling wave. A body to be driven (not shown) is joined to the output axis 203, and is driven by the rotary force of the rotor 202.

The application of a voltage to the piezoelectric ceramics results in the expansion and contraction of the piezoelectric ceramics due to a piezoelectric transverse effect. When an elastic body such as a metal is joined to the piezoelectric element, the elastic body is bent by the expansion and contraction of the piezoelectric ceramics. The ultrasonic motor of the kind described here utilizes the principle.

Next, an ultrasonic motor including a piezoelectric element having a laminated structure is illustrated in FIG. 2B. A vibrator 204 is formed of a laminated piezoelectric element 2042 interposed between tubular metal elastic bodies 2041. The laminated piezoelectric element 2042 is an element formed of multiple laminated piezoelectric ceramics (not shown), and includes a first electrode and a second electrode on its outer surface of lamination, and inner electrodes on its inner surface of lamination. The metal elastic bodies 2041 are fastened with bolts so that the piezoelectric element 2042 may be interposed between and fixed by the bodies. Thus, the vibrator 204 is formed.

The application of alternating electric field different from each other in phase to the piezoelectric element 2042 causes the vibrator 204 to excite two vibrations orthogonal to each other. The two vibrations are synthesized to form a circular vibration for driving the tip portion of the vibrator 204. Note that, a constricted circumferential groove is formed in the upper portion of the vibrator 204 to enlarge the displacement of the vibration for driving.

A rotor 205 contacts the vibrator 204 under a pressure from a spring 206 for pressurization to obtain a frictional force for driving. The rotor 205 is rotatably supported by a bearing.

Next, a dust removing device using the piezoelectric element of the present invention is described.

Figure 3A:
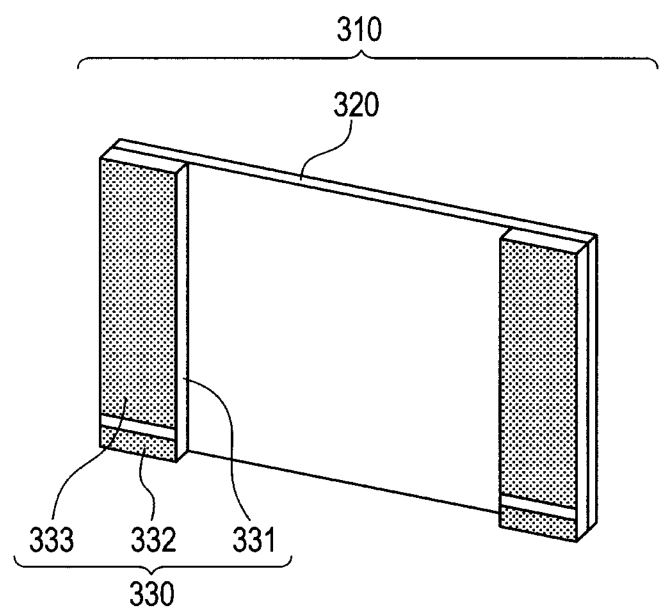
FIGS. 3A and 3B are schematic diagrams illustrating an embodiment of a dust removing device according to the present invention.
Figure 3B:
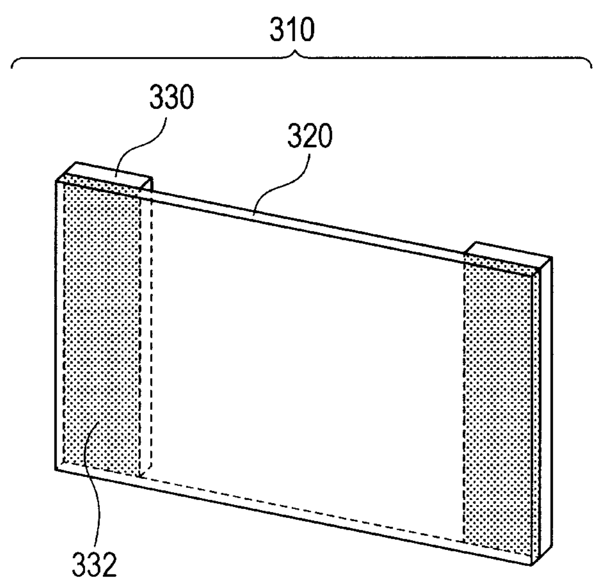

FIGS. 3A and 3B are schematic diagrams illustrating an embodiment of the dust removing device according to the present invention. The dust removing device 310 includes a plate-like piezoelectric element 330 and a vibration plate 320. The material of the vibration plate 320 is not limited. In the case where the dust removing device 310 is used for an optical device, a transparent material or a reflective material can be used as the material of the vibration plate 320. A piezoelectric material 331, a first electrode 332, and a second electrode 333 are provided.

Figure 4:
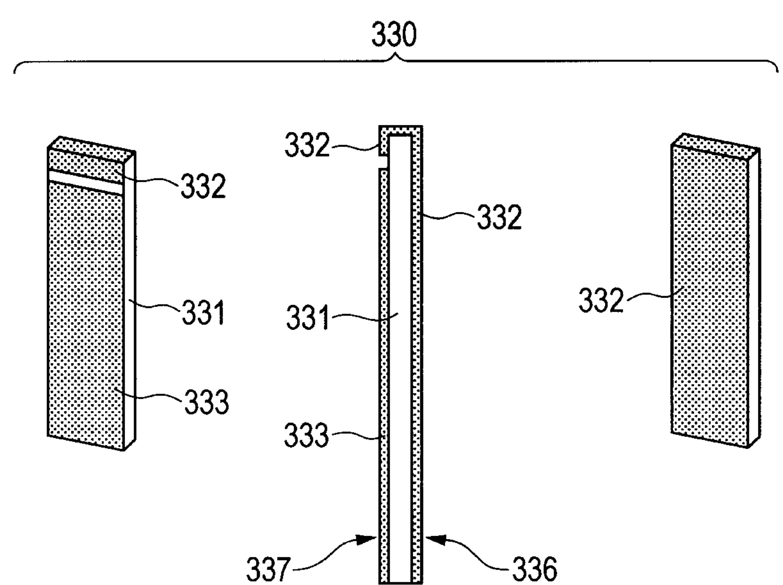
FIG. 4 is a schematic diagram illustrating a structure of a piezoelectric element 330 illustrated in FIGS. 3A and 3B according to the present invention.

FIG. 4 is a schematic diagram illustrating a structure of the piezoelectric element 330 illustrated in FIGS. 3A and 3B. The left side and the right side of FIG. 4 respectively illustrate a front surface structure and a rear surface structure of the piezoelectric element 330. The middle of FIG. 4 illustrates a side surface structure. As illustrated in FIG. 4, the piezoelectric element 330 includes the piezoelectric ceramics 331, the first electrode 332, and the second electrode 333. The first electrode 332 and the second electrode 333 are disposed so as to be opposed to the plate surfaces of the piezoelectric material 331. In the right side of FIG. 4, the front surface of the piezoelectric element 330 on which the first electrode 332 is disposed is referred to as a first electrode surface 336. In the left side of FIG. 4, the front surface of the piezoelectric element 330 on which the second electrode 332 is disposed is referred to as a second electrode surface 337.

Here, the electrode surface in the present invention means a surface of the piezoelectric element on which the electrode is disposed. For instance, as illustrated in FIG. 4, the first electrode 332 may extend around to the second electrode surface 337.

As illustrated in FIGS. 3A and 3B, as for the piezoelectric element 330 and the vibration plate 320, the plate surface of the vibration plate 320 is fixed to the first electrode surface 336 of the piezoelectric element 330. When the piezoelectric element 330 is driven, a stress is generated between the piezoelectric element 330 and the vibration plate 320, so that out-of-plane vibration is generated by the vibration plate. The dust removing device 310 of the present invention is a device that removes foreign matters such as dust sticking to the surface of the vibration plate 320 by the out-of-plane vibration of the vibration plate 320. The out-of-plane vibration means elastic vibration in which the vibration plate moves in the optical axis direction, namely in the thickness direction of the vibration plate.

Figures 5A, 5B:
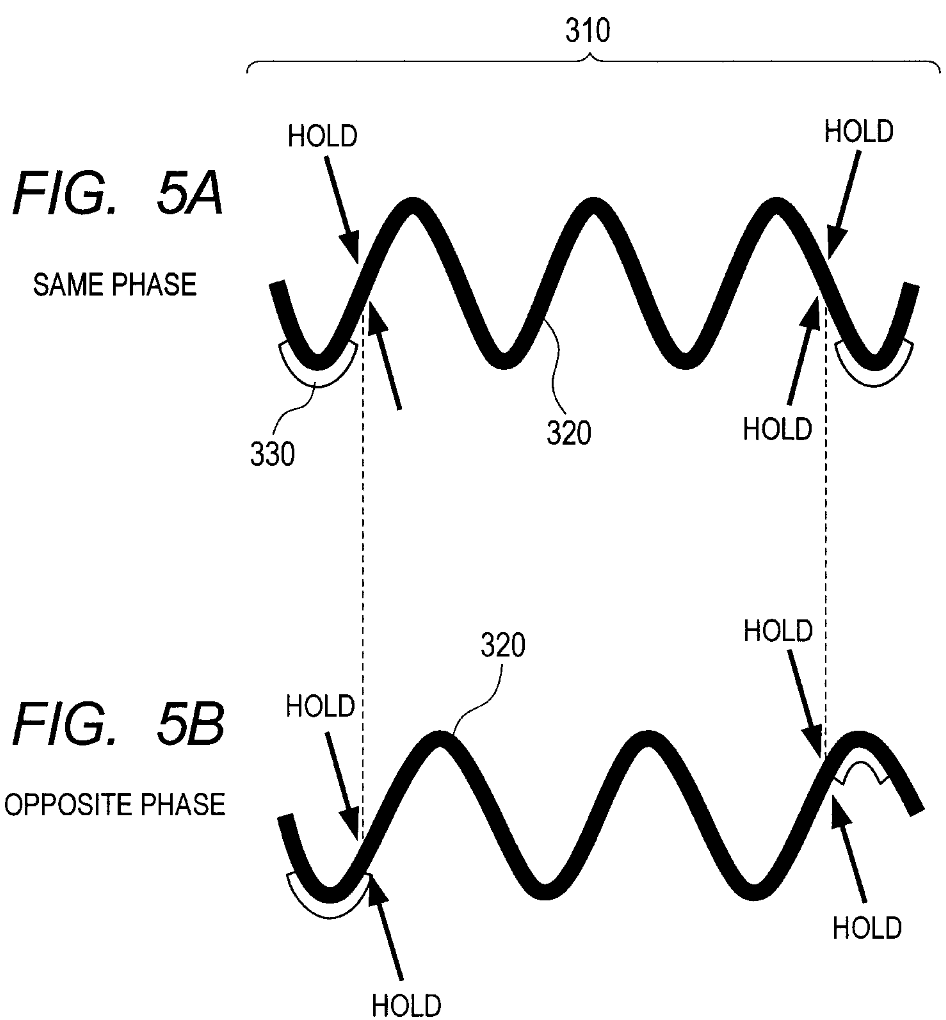
FIGS. 5A and 5B are schematic diagrams illustrating a vibration principle of the dust removing device 310 according to the present invention.

FIGS. 5A and 5B are schematic diagrams illustrating a vibration principle of the dust removing device 310 according to the present invention. FIG. 5A illustrates the state in which alternating electric fields having the same phase are applied to the pair of left and right piezoelectric elements 330 so that the out-of-plane vibration is generated in the vibration plate 320. The polarization direction of the piezoelectric ceramics constituting the pair of left and right piezoelectric elements 330 is the same as the thickness direction of the piezoelectric element 330, and the dust removing apparatus 310 is driven by the seventh vibrational mode. FIG. 5B illustrates the state in which alternating electric fields having opposite phases by 180 degrees are applied to the pair of left and right piezoelectric elements 330 so that the out-of-plane vibration is generated in the vibration plate 320. The dust removing device 310 is driven by the sixth vibrational mode. The dust removing device 310 of the present invention is a device that can effectively remove dust sticking to the surface of the vibration plate by using at least two vibrational modes selectively.

As described above, the piezoelectric element according to the present invention is suitably applicable to the liquid discharge head, the ultrasonic motor, and the dust removing device.

By using the lead-free piezoelectric ceramics containing the preferentially-oriented oxide ceramics of the present invention, it is possible to provide the liquid discharge head having the same or higher nozzle density and discharge force than the case where the piezoelectric ceramics containing lead is used.

By using the lead-free piezoelectric ceramics containing the preferentially-oriented oxide ceramics of the present invention, it is possible to provide the ultrasonic motor having the same or higher driving force and durability than the case where the piezoelectric ceramics containing lead is used.

By using the lead-free piezoelectric ceramics containing the preferentially-oriented oxide ceramics of the present invention, it is possible to provide the dust removing device having the same or higher dust-removing efficiency than the case where the piezoelectric ceramics containing lead is used.

The piezoelectric ceramics of the present invention can be used for a liquid discharge head, a motor, and other devices such as an ultrasonic resonator, a piezoelectric actuator, a piezoelectric sensor, and a ferroelectric memory.

Hereinafter, the piezoelectric material of present invention is described more specifically by way of examples. However, the present invention is not limited by the following examples. Note that, the part of the results of the examples and comparative examples are shown in Table 1 and Table 2.

Comparative Example 1

Under an environment where no magnetic field is applied, slip casting of a tetragonal $BaTiO_3$ crystal was performed so as to produce a compact.

First, slurry was made, which contains a powder of tetragonal barium titanate ($BaTiO_3$) produced by solid-state reaction, water, and dispersant. Typical ingredients of the slurry were oxide powder at 60 percent by weight, carboxylic acid dispersant at 2 percent by weight, and water at 38 percent by weight. In order to disperse the grains so as to decrease the viscosity of the slurry, the type and amount of the dispersant are not limited to the above-mentioned ones. Grains in the slurry were mixed and milled by a ball milling until the grain diameter evaluated by the dynamic light scattering became approximately one micron or smaller.

Figure 6:
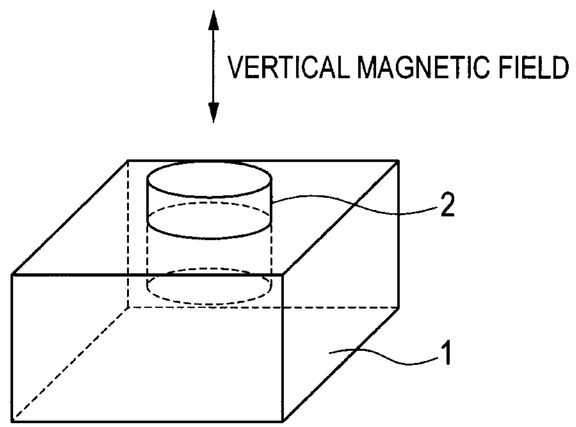
FIG. 6 is a schematic diagram illustrating a plaster mold placed in a vertical magnetic field that is used for the present invention.

The obtained slurry was supplied into the plaster mold, and the compact was produced by slip casting. A shape of the plaster mold is arbitrary in principle. In the Comparative Example and Example of the present invention, a plaster mold 1 was used, which had a rectangular parallelepiped shape with a cylindrical bore (having a diameter of 24 mm and a depth of 10 mm) formed in the center thereof. As illustrated in FIG. 6, belt-like film 2 having a width larger than the depth of the bore was rolled and inserted into the bore so that the wall surface of the bore was covered with the film. After supplying the slurry into the plaster mold, the plaster mold was left until moisture in the slurry was absorbed by the plaster mold to a certain extent so that the slurry became the compact. After that, the compact was removed from the plaster mold. The removed compact was dried in the air for 24 hours.

FIG. 6 illustrates the direction in which the vertical magnetic field is applied, but this Comparative Example 1 is an example of slip casting without magnetic field, in which no magnetic field is applied during the slip casting.

Figure 7:
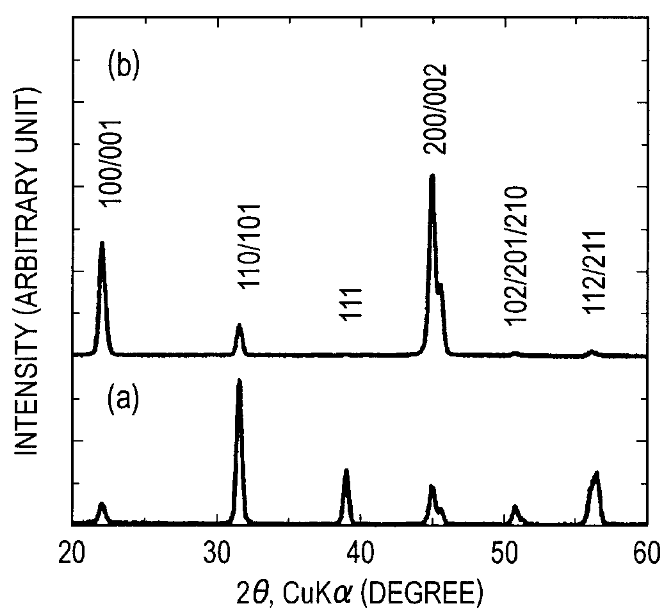
FIG. 7 illustrates x-ray diffraction patterns after sintering a compact of tetragonal barium titanate, in which (a) indicates a case where the applied magnetic field is 0 T, and (b) indicates a case where the applied magnetic field is 10 T.

The obtained compact was sintered at a temperature of 1,300 to 1,400 degrees centigrade in the air for 2 to 6 hours, and thus sample A was obtained. After polishing the surface of the sample A, the structural phase and the crystal orientation of the sample A were evaluated by X-ray diffraction. As a result, it was found that the sample A consists of randomly-oriented tetragonal barium titanate (see (a) of FIG. 7).

Comparative Example 2

The slip casting described above in Comparative Example 1 was performed in the vertical magnetic field of 10 T generated by a superconducting magnet as illustrated in FIG. 6. The plaster mold was left in the magnetic field for a while till the moisture in the slurry was absorbed by the plaster mold so that the slurry became the compact. After that, the plaster mold was taken out from the magnetic field. Subsequently, the plaster mold was dried for a night, and then the compact was taken out from the plaster mold. The obtained compact was sintered at a temperature of 1,300 to 1,400 degrees centigrade in the air for 2 to 6 hours, and thus sample B was obtained. After polishing the surface of the sample B, the structural phase and the crystal orientation of the sample B were evaluated by X-ray diffraction. As a result, it was found that the sample B consists of (001)-oriented tetragonal barium titanate (see (b) of FIG. 7). In this case, the Lotgering factor that indicates the degree of (111) orientation was −12%. The Lotgering factor was calculated using a peak between 20 to 50 degrees of the diffraction angle (2θ) measured by the X-ray having a wave length of 0.15406 nm (the same is true for the following cases).

As described above, the sintered bodies of tetragonal barium titanate showed random or (001) orientation, when their compacts were made by slip casting under no or 10 T magnetic field, respectively. In other words, if the oxide crystal B contains only the tetragonal barium titanate, a (111)-oriented sintered body of tetragonal barium titanate is hardly obtained regardless of whether a strong magnetic field was applied during the slip casting.

Next, an effect of using 6H type hexagonal crystals as the oxide crystal B for obtaining sintered bodies of (111)-oriented tetragonal barium titanate is described.

Comparative Example 3

Powder having a composition expressed by Ba:Ti:Mn=1.00:0.98:0.01 as a molar ratio was produced. As raw materials thereof, barium carbonate, titanium oxide, and manganese monoxide were used. Individual powders were weighed and mixed so as to obtain a desired composition. The mixed powder was calcined at a temperature of 900 to 1,250 degrees centigrade in the air for 2 to 20 hours. Next, the calcined powder was milled by a ball milling and was classified using sieves of 50 to 250 microns. The steps from the calcination to the classifying were performed once or twice.

Figure 8:
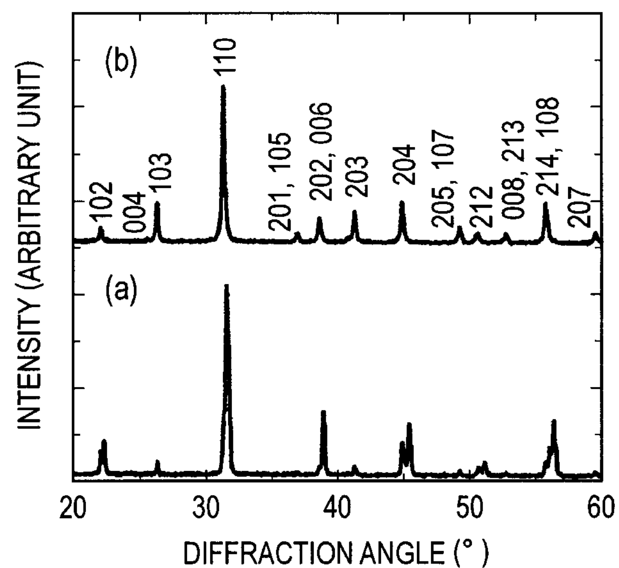
FIG. 8 illustrates x-ray diffraction patterns of hexagonal crystal, in which (a) indicates a case of $Ba(Ti_{0.98}Mn_{0.01})O_{3+\alpha}$, and (b) indicates a case of $Ba(Ti_{0.9}Mn_{0.05})O_{3+\alpha}$.

The powder of barium titanate used in Comparative Examples 1 and 2 had white color, but the obtained calcined powder had brown color. According to the X-ray diffraction measurement, the sample was constituted of two phases, namely the tetragonal crystal phase and the hexagonal crystal phase (see (a) of FIG. 8).

The above-mentioned calcined powder is mixed with $Nb_2O_5$ powder that gives Nb having the same number of moles of Mn in the calcined powder so as to be used in the following slip casting.

Next, a slurry containing the mixed oxide powder was adjusted. Typical ingredients of the slurry were the same as Comparative Example 1. Grains in the slurry were mixed and shredded by a ball milling until the grain diameter evaluated by the dynamic light scattering became approximately one micron or smaller.

The obtained slurry was supplied into the plaster mold placed in the magnetic field of 10 T generated by the superconducting magnet as illustrated in FIG. 6.

In the slurry, the oxide crystal B is oriented by the torque of the magnetic field.

The moisture in the slurry was gradually absorbed by the plaster mold so that the oriented crystal grains were deposited. After the moisture in the slurry was absorbed by the plaster mold to a certain extent so that the slurry became the compact, the plaster mold was taken out from the magnetic field. After that, the plaster mold was dried for a night, and then the compact was taken out from the plaster mold. The obtained compact was sintered at a temperature of 1,300 to 1,400 degrees centigrade in the air for 2 to 6 hours, and thus sample C was obtained. After that, the X-ray diffraction measurement was performed, and the sample C was a tetragonal crystal with (001) orientation. However, compared with the sample B, intensity of 111 diffraction with respect to 110 diffraction was larger in the sample C. Therefore, at least the effect of containing the hexagonal crystal in the oxide crystal B was confirmed. The Lotgering factor that indicates the degree of (111) orientation was −2%.

Comparative Example 4

Powder having a composition expressed by Ba:Ti:Mn=1.00:0.96:0.02 as a molar ratio was produced. The producing method is the same as Comparative Example 3. The obtained calcined powder had brown color. According to the X-ray diffraction measurement, the sample was constituted of two phases, namely the tetragonal crystal phase and the hexagonal crystal phase.

Subsequently, the slip casting was performed by a method similar to Comparative Example 3, so as to produce a compact. The obtained compact was sintered at a temperature of 1,300 to 1,400 degrees centigrade in the air for 2 to 6 hours, and thus sample D was obtained. After polishing the surface of the sample D, the structural phase and the crystal orientation of the sample D were evaluated by X-ray diffraction. As a result, it was found that the sample D consists of (001)-oriented tetragonal barium titanate. The Lotgering factor that indicates the degree of (111) orientation was −2%.

Example 1

Powder having a composition expressed by Ba:Ti:Mn=1.00:0.9:0.05 as a molar ratio was produced. The producing method is the same as Comparative Example 3. The obtained calcined powder had brown color. According to the X-ray diffraction measurement, the sample was constituted only of a hexagonal phase ((b) of FIG. 8). This result is different from Comparative Examples 3 and 4, for which a tetragonal phase was detected.

Further, the slip casting was performed in the same manner as for Comparative Example 3 in order to produce a compact.

The obtained compact was the hexagonal barium titanate with (001) orientation. $Nb_2O_5$ crystal added into the slurry was so little that the $Nb_2O_5$ crystal was not detected by the X-ray diffraction.

Figure 9:
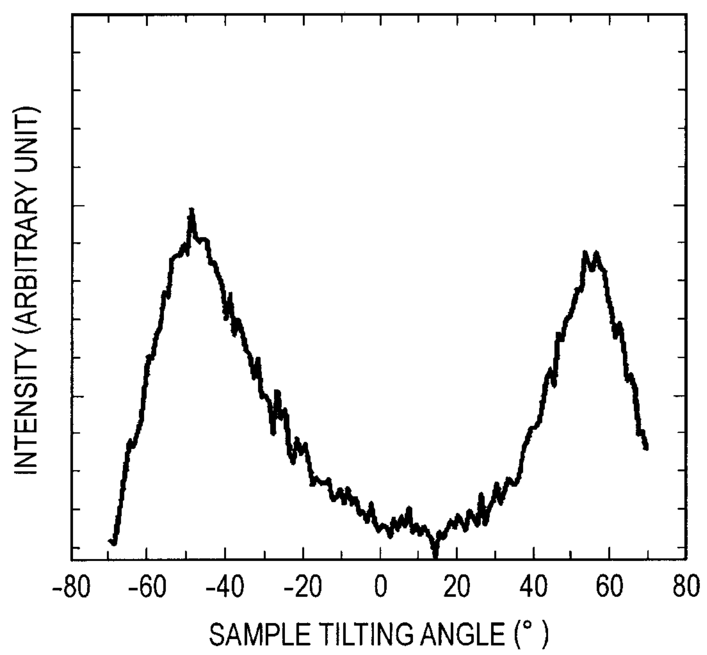
FIG. 9 illustrates sample tilting angle dependence of the 204 x-ray diffraction intensity of a compact of hexagonal $Ba(Ti_{0.9}Mn_{0.05})O_{3+\alpha}$ crystal.

FIG. 9 illustrates a sample tilting angle dependence of the 204 diffraction intensity of the hexagonal barium titanate. When the sample tilting angle is 0 degrees, the vertical direction of the sample is substantially parallel to the applied vertical magnetic field. The angle between (001) plane and (204) plane was calculated based on the hexagonal barium titanate structure described in ICDD 34-129, and the result was 54.6 degrees. In FIG. 9, the 204 diffraction intensity became largest at a tilting angle of approximately 55 degrees. This result indicates that the compact has (001) orientation. The same measurement was performed after rotating the sample about an axis in the vertical direction of the sample, and the result was substantially the same as that of FIG. 9.

Figure 10:
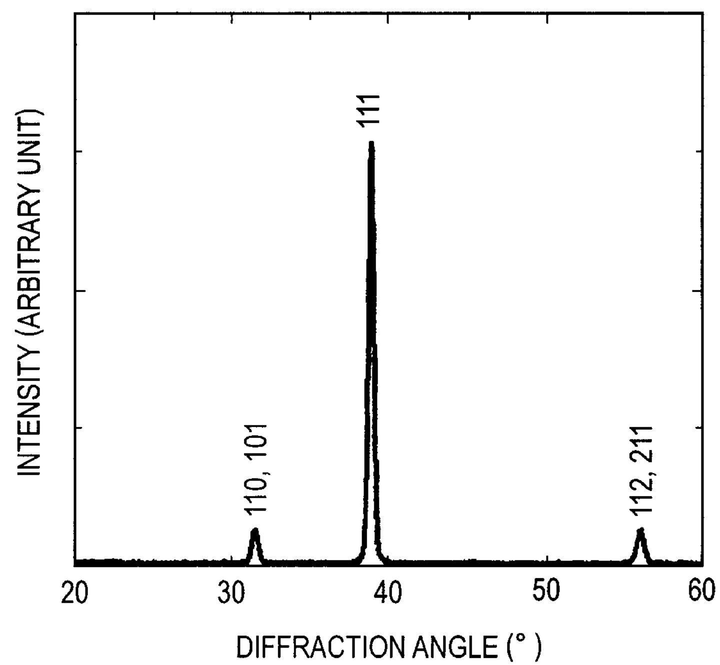
FIG. 10 illustrates an x-ray diffraction pattern measured after sintering hexagonal $Ba(Ti_{0.9}Mn_{0.05})O_{3+\alpha}+0.025Nb_2O_5$ a compact obtained by slip casting in 10 T magnetic field.

The obtained compact was sintered at a temperature of 1,300 to 1,400 degrees centigrade in the air for 2 to 6 hours, and thus sample E was obtained. After that, the X-ray diffraction measurement was performed. As a result, the sample E was a tetragonal crystal with (111) orientation. As illustrated in FIG. 10, a strong 111 diffraction was observed. The Lotgering factor that indicates the degree of (111) orientation was 76%.

Examples 2, 3, and 4

In Example 1, the Nb oxide powder having the same number of moles as Mn was added to the slurry. In contrast, W, V, or Ta was added instead of Nb as experiments, and thus samples F, G, and H were obtained. The samples F, G, and H were tetragonal crystals with (111) orientation, and the Lotgering factors that indicates the degree of (111) orientation were 83%, 61%, and 53%, respectively.

Comparative Examples 5 and 6

In Example 1, the Nb oxide powder having the same number of moles as Mn was added to the slurry. In contrast, Mo or Ti was added instead of Nb as experiments, and thus samples I and J were obtained. The crystals constituting the samples I and J were not changed to the tetragonal crystal after the sintering process but remained to be the hexagonal crystal. The tetragonal crystal with (111) orientation was not obtained. In other words, in order to change the hexagonal crystal to the tetragonal crystal by sintering, an element having higher valence than at least Ti was necessary.

In the examples described above, the oxide crystal B was obtained by substituting the B site of the barium titanate for Mn. Hereinafter, the case is described, where the oxide crystal B is obtained by reducing the oxide crystal A.

Example 5

The reduction treatment was performed on the tetragonal barium titanate powder (having a grain diameter of approximately 100 nm) produced by a hydrothermal synthesis method, and thus powder of the oxide crystal B was obtained. The reduction treatment was performed at the atmospheric pressure for 30 to 120 minutes in the atmosphere where the volume concentration of hydrogen is 99% or larger, and the temperature was 1,400 to 1,500 degrees centigrade. The powder after the reduction treatment was characterized by the X-ray diffraction. As a result, the structural phase was the hexagonal barium titanate. According to this reduction treatment, the weight of the barium titanate powder was reduced by 0.2 percent by weight. In addition, the color of the powder was changed from white to blue. When the reducing temperature was lowered to 1,250 degrees centigrade, the hexagonal barium titanate was also detected, but the tetragonal barium titanate was the primary phase. The primary phase means a phase giving the maximum peak when the X-ray diffraction is performed.

The hexagonal barium titanate powder reduced at a temperature of 1,450 degrees centigrade was annealed at a temperature of 1,000 degrees centigrade in the air for 1 to 6 hours. The color of the powder became light blue, but the structural phase of the powder did not change between before and after the annealing.

Next, slurry containing this hexagonal barium titanate powder was produced, and the slip casting of the slurry was performed in magnetic field. Ingredients of the used slurry, the steps, and the method of producing the compact were substantially the same as those in Example 1. However, no metallic component was added to the slurry for a purpose of changing the hexagonal crystal to the tetragonal crystal. N example 1, oxide powders of Nb, V, W, and Ta were add into the slurry for a purpose of changing the hexagonal crystal to the tetragonal crystal. However, no metal was added to the slurry for the same purpose in Example 4.

The compact obtained by the slip casting in the magnetic field was a hexagonal barium titanate with (001) orientation. The compact was oxidized and sintered at a temperature of 1,200 to 1,400 degrees centigrade in the air for 1 to 6 hours, and thus preferentially-oriented oxide ceramics (sample K) was obtained. The relative density of the sample K was 94% or larger.

A surface of the obtained preferentially-oriented oxide ceramics was ground, and the structural phase and the crystal orientation were evaluated by the X-ray diffraction after the grinding. As a result, the obtained preferentially-oriented ceramics was formed of a single phase of the tetragonal barium titanate. Further, similarly to FIG. 10, it was indicated that the relative intensity of 111 diffraction was strong, and the obtained ceramics had (111) orientation.

Comparative Example 7

For comparison with Example 5, the slip casting that had been performed in Example 5 was performed in an environment without magnetic field. The obtained compact of the hexagonal barium titanate was not orientated in the c-axis direction. The compact was sintered at a temperature of 1,300 degrees centigrade in the air for 6 hours, and thus sample L was obtained. The crystal system of the sample L was the tetragonal system, but the crystal orientation was random.

Next, the piezoelectric constant $d_{31}$ (pC/N) of the obtained samples was measured. The evaluation of the piezoelectric constant was performed in the following procedure.

First, the samples K and L were grounded to have a thickness of 0.5 mm. Using the sputtering method, Ti layers (having a thickness of 3 to 10 nm) were formed as adhesive layers on the front and rear sides of the sample, and then gold electrodes (having a thickness of 200 to 300 nm) were formed. After that, the sample was cut into rectangular pieces having a size of 10×2.5×0.5t mm.

Next, polarization treatment was performed on the sample. The sample was once kept at a temperature of 100 degrees centigrade, and a DC electric field of 1 kV/mm was applied for 30 minutes. After that, the sample was cooled naturally to room temperature, while the application of the electric field was kept until the sample temperature was lowered to room temperature.

The piezoelectric constant $d_{31}$ of the sample on which the polarization treatment was performed was measured by the resonance/anti-resonance method. A result of the measurement is shown in Table 2. It was confirmed that the sample with (111) orientation shows a larger piezoelectric constant than the randomly-oriented sample does.

Hereinafter, the case is described, where the oxide crystal A is kept at high temperature and then is quenched so as to obtain the oxide crystal B.

Example 6

The tetragonal barium titanate powder (having a grain diameter of approximately 100 nm) produced by the hydrothermal synthesis method was compressed by a method such as cold isostatic pressing (CIP), and thus a rod-like compact was made. This compact was heated to a temperature of 1,500 degrees centigrade or higher using a floating zone melting apparatus or the like, for example, and then was quenched, and thus the hexagonal barium titanate was obtained. The hexagonal barium titanate is a high temperature phase of the tetragonal barium titanate, and the hexagonal structure is maintained as a metastable phase even at room temperature by being quenched. Using the obtained crystal as the oxide crystal B, similarly to Example 5, the slip casting was performed in the magnetic field, and thus the compact was produced. The obtained compact was a hexagonal barium titanate with (001) orientation. The compact was oxidized and sintered at a temperature of 1,300 to 1,400 degrees centigrade in the air for 1 to 6 hours, and thus preferentially-oriented oxide ceramics (sample M) was obtained. The relative density of the sample M was 94% or larger. According to the X-ray diffraction measurement, the sintered sample M was a single phase of the tetragonal barium titanate. The recorded X-ray diffraction pattern was, similarly to FIG. 10, a pattern having higher relative intensity of 111 diffraction than the randomly-oriented sample. In other words, the obtained ceramics had (111) orientation.

The liquid discharge head, the ultrasonic motor, and the dust removing device illustrated in FIGS. 1A, 1B, 2A, 2B, and 3A to 5B were produced by way of trial using the preferentially-oriented oxide ceramics of the present invention, namely the barium titanate with (111) orientation, and good characteristics were obtained.

TABLE 1

| | Sample name | Composition | Principal structural phase before sintering | Magnetic field intensity (T) | Principal structural phase after sintering | Orientation | (111) Orientation Lotgering factor (%) |
|---|---|---|---|---|---|---|---|
| Comparative Example 1 | A | $B_aTiO_3$ | Tetragonal crystal | 0 | Tetragonal crystal | Random orientation | 0 |
| Comparative Example 2 | B | $B_aTiO_3$ | Tetragonal crystal | 10 | Tetragonal crystal | (001) | −12 |
| Comparative Example 3 | C | $Ba(Ti_{0.98}Mn_{0.01}Nb_{0.01})O_{3+\alpha}$ | Tetragonal crystal, Hexagonal crystal | 10 | Tetragonal crystal | (001) | −2 |
| Comparative Example 4 | D | $Ba(Ti_{0.96}Mn_{0.02}Nb_{0.02})O_{3+\alpha}$ | Tetragonal crystal, Hexagonal crystal | 10 | Tetragonal crystal | (001) | −2 |
| Example 1 | E | $Ba(Ti_{0.9}Mn_{0.05}Nb_{0.05})O_{3+\alpha}$ | Hexagonal crystal | 10 | Tetragonal crystal | (111) | 76 |
| Example 2 | F | $Ba(Ti_{0.9}Mn_{0.05}W_{0.05})O_{3+\alpha}$ | Hexagonal crystal | 10 | Tetragonal crystal | (111) | 83 |
| Example 3 | G | $Ba(Ti_{0.9}Mn_{0.05}V_{0.05})O_{3+\alpha}$ | Hexagonal crystal | 10 | Tetragonal crystal | (111) | 61 |
| Example 4 | H | $Ba(Ti_{0.9}Mn_{0.05}Ta_{0.05})O_{3+\alpha}$ | Hexagonal crystal | 10 | Tetragonal crystal | (111) | 53 |
| Comparative Example 5 | I | $Ba(Ti_{0.9}Mn_{0.05}Mo_{0.05})O_{3+\alpha}$ | Hexagonal crystal | 10 | Hexagonal crystal | — | — |
| Comparative Example 6 | J | $Ba(Ti_{0.9}Mn_{0.05}Ti_{0.05})O_{3+\alpha}$ | Hexagonal crystal | 10 | Hexagonal crystal | — | — |

TABLE 2

| | Sample name | Composition | Principal structural phase before sintering | Magnetic field intensity (T) | Principal structural phase after sintering | Orientation | Piezoelectric constant $d_{31}$ (pC/N) |
|---|---|---|---|---|---|---|---|
| Example 5 | K | $BaTiO_3$ | Hexagonal crystal | 10 | Tetragonal crystal | (111) | −76~−79 |
| Comparative Example 7 | L | $BaTiO_3$ | Hexagonal crystal | 0 | Tetragonal crystal | Random orientation | −50~−53 |

The manufacturing method for preferentially-oriented oxide ceramics according to the present invention can appropriately be applied to a wide range of oxide piezoelectric ceramics. Using crystal orientation control of the present invention, it is possible to increase piezoelectric performance of the piezoelectric ceramics compared with randomly-oriented ceramics. In particular, lead-free piezoelectric material is environment-friendly, too. Therefore, it can be used without problem for devices such as a liquid discharge head, an ultrasonic motor, or a dust removing device, which uses a lot of piezoelectric ceramics.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. Perovskite ceramics containing oxide ceramics expressed by general formula (1), wherein a c-axis of the perovskite ceramics is tilted radially from a specific axis by 40 to 70 degrees:

general formula (1)

$$BaTi_{1-x-y}(Mn_xM_y)O_{3+\alpha},$$

where M represents at least one element selected from the group consisting of V, Nb, Ta, and W, and $0.02<x\leq0.05$, $0<y\leq0.05$, and $-0.05<\alpha\leq0.05$ are satisfied.

2. A piezoelectric element, comprising:

a first electrode;

a piezoelectric material; and a second electrode, wherein the piezoelectric material comprises the preferentially-oriented oxide ceramics according to claim 1.

3. A liquid discharge head, comprising the piezoelectric element according to claim 2.

4. An ultrasonic motor, comprising the piezoelectric element according to claim 2.

5. A dust removing device, comprising the piezoelectric element according to claim 2.

6. The piezoelectric element according to claim 2, wherein the specific axis is any one of a perpendicular line to a surface of a sample, a growing direction of a compact, and an axis connecting a pair of the electrodes given to the sample by a shortest distance.

7. The perovskite ceramics according to claim 1, wherein the perovskite ceramics has a (111) orientation.

8. The perovskite ceramics according to claim 1, wherein a Lotgering factor of the perovskite ceramics is from 53% to 100%.

* * * * *